(12) United States Patent
Nishida et al.

(10) Patent No.: US 10,790,193 B2
(45) Date of Patent: *Sep. 29, 2020

(54) WAFER PROCESSING METHOD

(71) Applicant: DISCO CORPORATION, Tokyo (JP)

(72) Inventors: Yoshiteru Nishida, Tokyo (JP); Hidekazu Iida, Tokyo (JP); Susumu Yokoo, Tokyo (JP); Hiroyuki Takahashi, Tokyo (JP); Kenta Chito, Tokyo (JP)

(73) Assignee: DISCO Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/375,066

(22) Filed: Apr. 4, 2019

(65) Prior Publication Data

US 2019/0311952 A1    Oct. 10, 2019

(30) Foreign Application Priority Data

Apr. 9, 2018 (JP) .................................. 2018-074776

(51) Int. Cl.
*H01L 21/78* (2006.01)
*H01L 21/683* (2006.01)
*H01L 21/304* (2006.01)

(52) U.S. Cl.
CPC .......... *H01L 21/78* (2013.01); *H01L 21/3043* (2013.01); *H01L 21/6836* (2013.01)

(58) Field of Classification Search
CPC . H01L 21/3043; H01L 21/78; H01L 21/6836; H01L 21/22; H01L 2221/6834; H01L 2221/68327; H01L 21/6838; H01L 21/02013; H01L 21/0622; H01L 21/30625; H01L 21/322; H01L 21/67092; H01L 21/304; H01L 21/3065; B23K 26/40; B23K 26/351; B23K 26/02; B23K 2101/40; B23K 2103/50; B23K 26/0622
See application file for complete search history.

(56) References Cited

U.S. PATENT DOCUMENTS

| 8,513,096 | B2* | 8/2013 | Shimotani | ............... H01L 21/78 257/E21.599 |
| 2006/0197260 | A1* | 9/2006 | Yoshikawa | ............ B23K 26/10 264/482 |
| 2011/0287609 | A1* | 11/2011 | Kobayashi | ............ H01L 21/304 438/464 |

(Continued)

FOREIGN PATENT DOCUMENTS

JP          2010177430 A        8/2010

*Primary Examiner* — Thanh T Nguyen
(74) *Attorney, Agent, or Firm* — Greer Burns & Crain Ltd.

(57) ABSTRACT

A method for processing a wafer in which patterns including a metal layer are formed on streets. The method includes: a step of applying a laser beam along the streets formed with the patterns to form laser processed grooves having a depth in excess of a finished thickness of the wafer while removing the patterns; a step of grinding a back surface side of the wafer to thin the wafer to the finished thickness, and to expose the laser processed grooves to the back surface of the wafer, thereby dividing the wafer into a plurality of device chips; a step of removing a crushed layer formed on the back surface side of the wafer; and a step of forming a strain layer on the back surface side of the wafer by plasma processing using an inert gas.

4 Claims, 10 Drawing Sheets

(56) References Cited

U.S. PATENT DOCUMENTS

2015/0364375 A1\* 12/2015 Nakamura ............ H01L 21/268
  438/462
2018/0218896 A1\*  8/2018 Hirata ..................... C30B 33/06
2019/0311951 A1\* 10/2019 Nishida ................ B23K 26/351

\* cited by examiner

WAFER PROCESSING METHOD

BACKGROUND OF THE INVENTION

Field of the Invention

The present invention relates to a method for processing a wafer in which patterns including a metal layer are formed on streets.

Description of the Related Art

A wafer formed with devices such as integrated circuits (ICs) on the front surface thereof is divided along streets (division lines), whereby a plurality of device chips each including the device are obtained. The division of the wafer is conducted, for example, by using a cutting apparatus in which an annular cutting blade for cutting the wafer is mounted. The cutting blade is rotated and is made to cut into the wafer along the streets, whereby the wafer is cut and divided.

The device chips obtained by the division of the wafer are incorporated into various electronic apparatuses; in recent years, attendant on reductions in the size and thickness of electronic apparatuses, reductions in the size and thickness of the device chips have also been demanded. In view of this, a technique of grinding the back surface of the wafer by a grindstone to thin the device chips has been used. When the back surface of the wafer is ground by the grindstone, minute ruggedness (minute projections and recesses) and cracks are formed in the ground region. Since the presence of the region formed with the ruggedness or cracks (crushed layer) would lower the die strength of the wafer, the crushed layer is removed by polishing with a polishing pad or by dry etching or the like after the grinding.

On the other hand, it is known that when the crushed layer is left on the wafer, a gettering effect is obtained by which metallic elements such as copper contained in the inside of the wafer are captured into the crushed layer. Therefore, when the crushed layer is formed on the back surface side of the wafer, the metallic elements are captured to the back surface side of the wafer, whereby the metallic elements can be prevented from moving into the devices formed on the front surface side of the wafer. As a result, generation of defects (current leakage or the like) in the devices due to the metallic elements inside the wafer is restrained. When the crushed layer is removed for enhancing the die strength of the wafer, however, the gettering effect also is lost. In view of this, there has been proposed a method in which minute ruggedness or cracks (strain) finer than those of the crushed layer are formed on the back surface of the wafer, after removal of the crushed layer, and the metallic elements are captured in the region formed with this strain (strain layer). By this, a gettering effect on the metallic elements can be obtained without largely lowering the die strength of the wafer. Japanese Patent Laid-open No. 2010-177430 discloses a technique in which after a crushed layer formed by grinding the back surface of a wafer is removed by a plasma etching treatment, a plasmatized inert gas is applied to the back surface of the wafer to form a strain layer (gettering layer).

SUMMARY OF THE INVENTION

Patterns including a metal layer that are not constituent elements of devices, such as a test element group (TEG) for device evaluation and columnar metallic patterns (pillars) for supporting on the streets an insulating film or the like formed at the time of manufacturing the devices, are often formed on the streets partitioning the devices formed on a wafer. Since the patterns (dummy patterns) do not relate to operations of the device chips obtained by dividing the wafer, they are cut and removed together with the wafer at the time of cutting the wafer by a cutting blade. However, when the dummy patterns including the metal layer are cut by the cutting blade, the cutting blade and the metal layer contact each other, and protrusions (burs) of the metal are generated. When the plasma processing for the formation of the aforementioned strain layer or the like is applied to the wafer formed with the burs, electric discharge may be generated in the region formed with the burs, possibly leading to breakage of the devices.

The present invention has been made in consideration of the above-mentioned problems. It is therefore an object of the present invention to provide a wafer processing method by which generation of electric discharge at the time of plasma processing of a wafer can be restrained and breakage of devices can be prevented.

In accordance with an aspect of the present invention, there is provided a method for processing a wafer in which devices are formed respectively in regions on a front surface side partitioned by a plurality of streets and in which patterns including a metal layer are formed on the streets, the method including: a laser processing step of applying a laser beam of such a wavelength as to be absorbed in the wafer along the streets formed with the patterns, to form laser processed grooves having a depth in excess of a finished thickness of the wafer while removing the patterns; a protective member adhering step of adhering a protective member to the front surface side of the wafer formed with the laser processed grooves; a grinding step of holding the wafer by a chuck table through the protective member, grinding a back surface side of the wafer to thin the wafer to the finished thickness, and to expose the laser processed grooves to the back surface of the wafer, thereby dividing the wafer into a plurality of device chips;

a crushed layer removing step of removing a crushed layer formed on the back surface side of the wafer by the grinding of the wafer; and a strain layer forming step of forming a strain layer on the back surface side of the wafer deprived of the crushed layer, by plasma processing using an inert gas.

Note that, preferably, in the crushed layer removing step, the crushed layer is removed by polishing with a polishing pad. Besides, preferably, in the crushed layer removing step, the crushed layer is removed by plasma etching using a halogen-containing gas. In addition, preferably, the method for processing the wafer further includes a protective film forming step of forming a water-soluble protective film on the front surface side of the wafer before the laser processing step, and a protective film removing step of removing the protective film from the front surface side of the wafer after the laser processing step.

In the method for processing the wafer according to the described aspect of the present invention, laser processed grooves having a depth in excess of the finished thickness of the wafer are formed while removing the patterns including a metal layer that are formed on the streets of the wafer, by application of the laser beam. By this, the wafer can be processed without using a cutting blade, and generation of metal burs is restrained. Therefore, at the time of applying plasma processing to the wafer to form the strain layer on the back surface of the wafer, generation of electric discharge is restrained, and damaging of the devices is prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
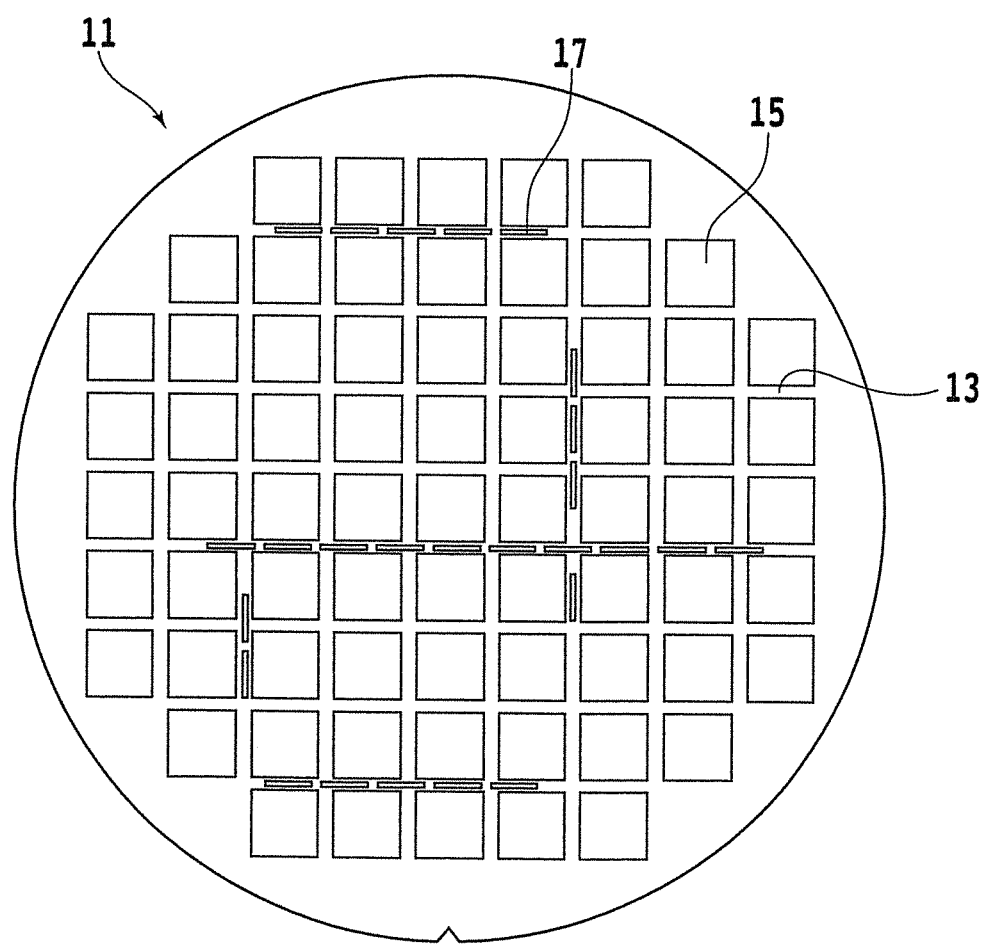
FIG. 1 is a plan view depicting a configuration example of a wafer.

An embodiment of the present invention will be described below, referring to the attached drawings. In the first place, an example of a wafer to be processed by a method for processing a wafer according to the present embodiment will be described. FIG. 1 is a plan view depicting a configuration example of a wafer 11.

The wafer 11 is formed in a disk shape from such a material as silicon, and is partitioned into a plurality of regions by a plurality of streets (division lines) 13 arranged in a grid pattern. In addition, a device 15 including an IC or the like is formed in each of the regions partitioned by the streets 13 on the front surface side of the wafer 11. Note that while the disk-shaped wafer 11 formed from such a material as silicon is used in the present embodiment, the material, shape, structure, size, and the like of the wafer 11 are not limited. For example, a wafer 11 formed from such a material as other semiconductor than silicon, a ceramic, a resin, or a metal may also be used. Similarly, the kind, number, shape, structure, size, layout, and the like of the devices 15 are not limited.

In addition, at least part of the streets 13 are formed with patterns 17 including a metal layer. The patterns 17 are patterns (dummy patterns) including a metal layer not being a constituent element of the devices 15, and are composed, for example, of TEG for device evaluation, or columnar metal patterns (pillars) for supporting an insulating film formed at the time of device production or the like on the streets 13. Note that an example in which the patterns 17 are disposed on part of the streets 13 is depicted in FIG. 1, the patterns 17 may be disposed on all the streets 13.

By dividing the wafer 11 along the streets 13, a plurality of device chips respectively including the devices 15 are obtained. In the present embodiment, description will be made of an example in which grooves having a depth of less than the thickness of the wafer 11 are first formed (half cut) on the front surface side of the wafer 11, and thereafter the back surface side of the wafer 11 is ground by a grindstone, to thereby divide the wafer 11 into a plurality of device chips.

At the time of forming the grooves on the front surface side of the wafer 11, for example, a cutting apparatus equipped with an annular cutting blade can be used. In the case of using the cutting apparatus, the cutting blade is rotated and made to cut into the wafer 11, thereby to form the grooves in the wafer 11. It is to be noted, however, that since at least part of the streets 13 are formed with the patterns 17 including the metal layer, formation of the grooves along the streets 13 by this method results in that the patterns 17 are cut by the cutting blade. The patterns 17 include the metal layer, so that when the metal layer is cut by the cutting blade, the metal layer is extended by the cutting blade, to generate metal protrusions (burs). Where the burs are left on the wafer 11, when plasma processing is conducted in a later step (for example, a strain layer forming step which will be described later), electric discharge may be generated in the regions where the burs are formed, possibly leading to breakage of the device 15.

In view of this, in the wafer processing method according to the present embodiment, removal of the patterns 17 and half-cutting of the wafer 11 are performed by application of a laser beam. As a result, the wafer 11 can be half-cut without cutting the patterns 17 by a cutting blade, and, therefore, it is possible to prevent generation of burs and to restrain generation of electric discharge at the time of plasma processing. The wafer processing method according to the present embodiment will be specifically described below.

Figure 2:
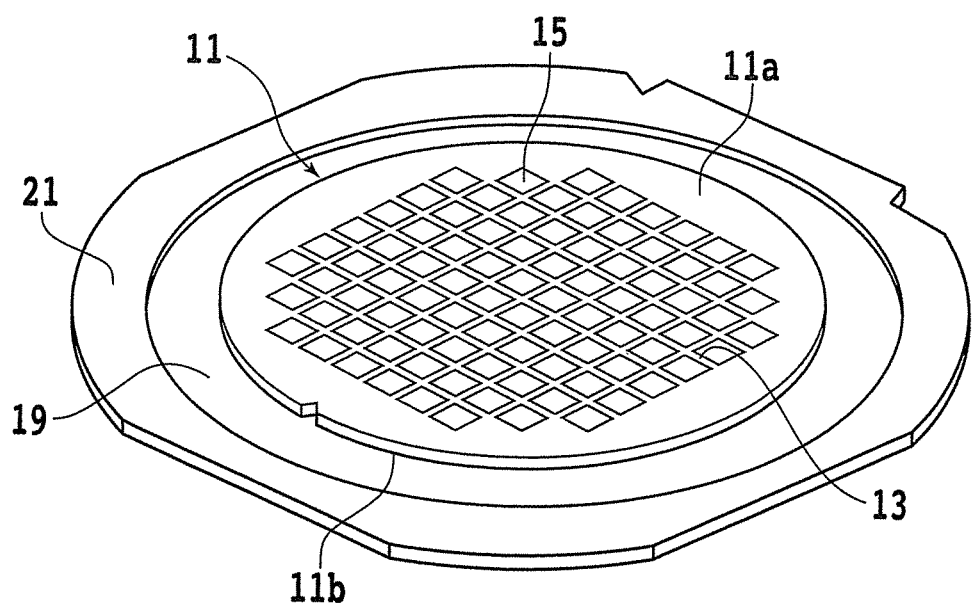
FIG. 2 is a perspective view of the wafer in the state of being supported by an annular frame.

First, in order to hold the wafer 11 on a laser processing apparatus, the wafer 11 is supported by an annular frame. FIG. 2 is a perspective view of the wafer 11 in the state of being supported by the annular frame 21. Note that the patterns 17 are omitted from illustration in FIG. 2. The annular frame 21 is adhered along an outer periphery of a disk-shaped adhesive tape 19 formed from a resin or the like, and a back surface 11b side of the wafer 11 is adhered to the adhesive tape 19. As a result, the wafer 11 is supported on the annular frame 21 in the state in which its front surface 11a is exposed to the upper side.

Figure 3:
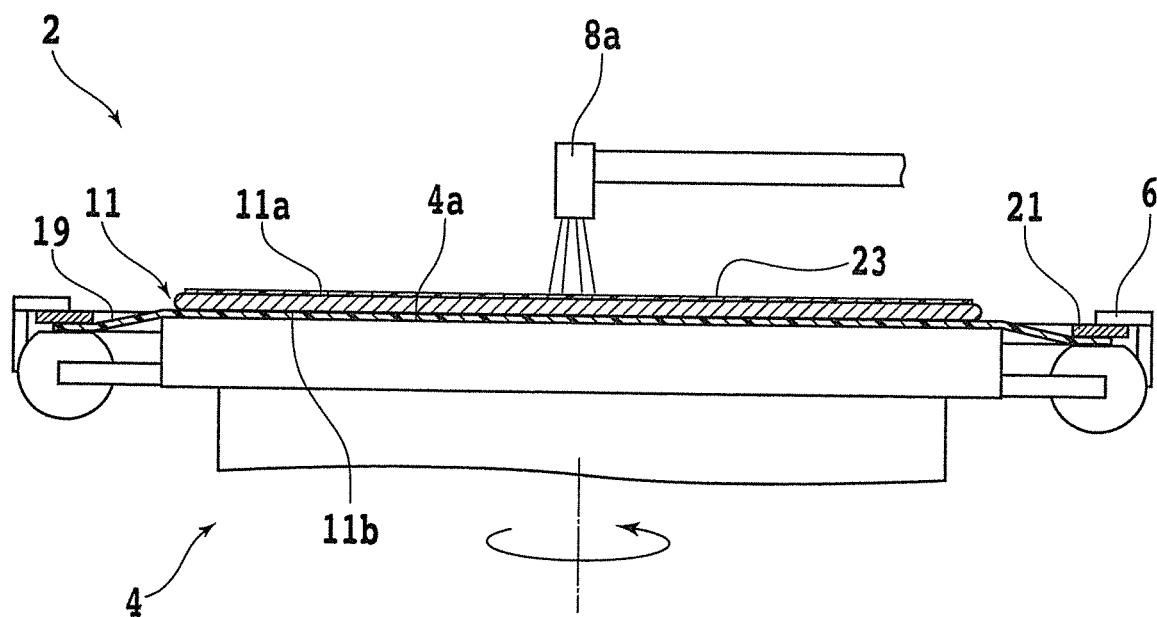
FIG. 3 is a partly sectional side view depicting the manner in which a protective film is formed on the wafer.

Next, a water-soluble protective film is formed on the front surface 11a side of the wafer 11 (protective film forming step). FIG. 3 is a partly sectional side view depicting the manner in which the water-soluble protective film 23 is formed on the front surface 11a side of the wafer 11. The protective film 23 can be formed by use of a spin coater 2, for example. The spin coater 2 includes a spinner table 4 that supports the wafer 11, a plurality of clamps 6 that fix the annular frame 21 supporting the wafer 11, and a nozzle 8a for jetting a material for the protective film 23, which includes a water-soluble resin or the like, toward the wafer 11.

First, the wafer 11 is disposed on the spinner table 4, and the annular frame 21 is fixed by the clamps 6. Part of an upper surface of the spinner table 4 constitutes a holding surface 4a for suction holding the wafer 11 through the adhesive tape 19. The holding surface 4a is connected to a suction source (not illustrated) through a suction passage (not illustrated) or the like formed inside the spinner table 4. A negative pressure of the suction source is made to act on the holding surface 4a, whereby the wafer 11 is suction held by the spinner table 4. Note that a chuck table for holding the wafer 11 by a mechanical method, an electrical method, or the like may be used in place of the spinner table 4.

Then, while the spinner table 4 suction holding the wafer 11 by the holding surface 4a is being rotated around a rotational axis substantially parallel to the vertical direction, a water-soluble resin such as polyvinyl alcohol (PVA) or polyethylene glycol (PEG) is jetted from the nozzle 8a disposed on the upper side of the spinner table 4. As a result, the water-soluble resin adhering to the wafer 11 flows to an outer peripheral portion of the wafer 11 under a centrifugal force, whereby the water-soluble protective film 23 is formed on the front surface 11a side of the wafer 11. The protective film 23 is formed for preventing fine particles (debris) scattered from a processing region, at the time of application of a laser beam to the front surface 11a of the wafer 11 in a later step, from adhering to the front surface 11a of the wafer 11. It is to be noted, however, that the protective film forming step may not necessarily be carried out, and the protective film forming step may be omitted, for example, in the case where the application of the laser beam is conducted under such processing conditions that debris is hardly generated, or in the case where adhesion of debris is not liable to become a problem.

Figure 4A:
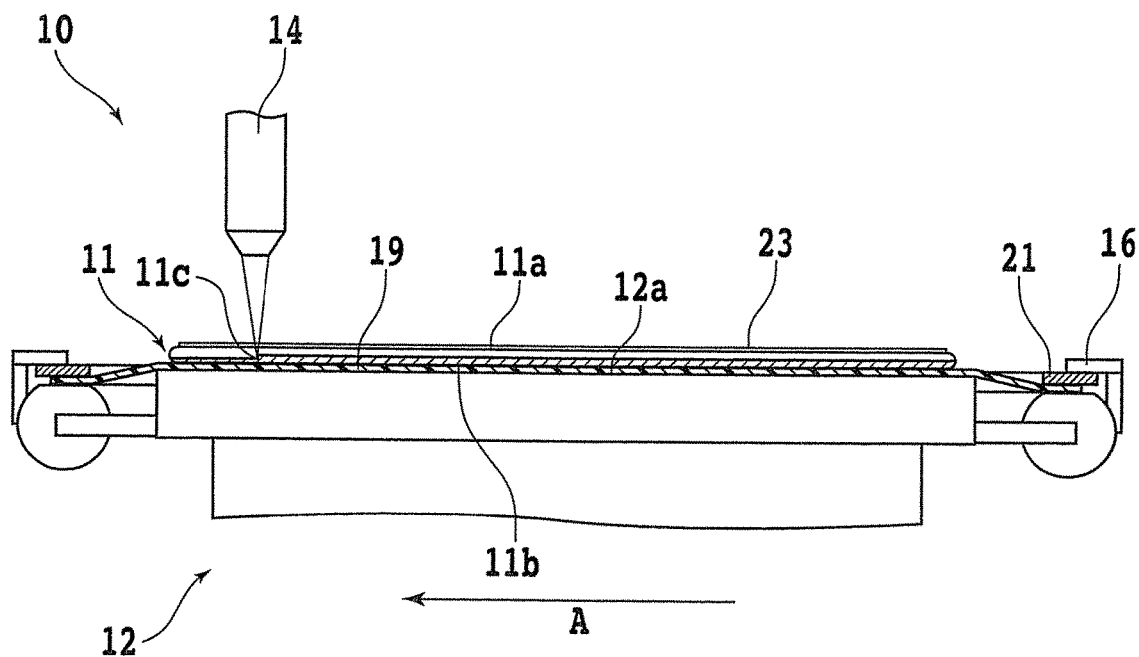
FIG. 4A is a partly sectional side view depicting the manner in which a laser beam is applied to the wafer.

Subsequently, a laser beam of such a wavelength as to be absorbed in the wafer 11 is applied along the streets 13 formed with the patterns 17, to form laser processed grooves having a depth in excess of a finished thickness of the wafer 11 while removing the patterns 17 (laser processing step). The application of the laser beam to the wafer 11 is performed using a laser processing apparatus. FIG. 4A is a partly sectional side view depicting the manner in which the laser beam is applied to the wafer 11.

The laser processing apparatus 10 includes a chuck table 12 that suction holds the wafer 11, a laser applying unit 14 that applies the laser beam of such a wavelength as to be absorbed in the wafer 11, and a plurality of clamps 16 that fix the annular frame 21 supporting the wafer 11.

First, the wafer 11 is disposed on the chuck table 12, and the annular frame 21 is fixed by the clamps 16. Part of an upper surface of the chuck table 12 constitutes a holding surface 12a that suction holds the wafer 11 through the adhesive tape 19. The holding surface 12a is connected to a suction source (not illustrated) through a suction passage (not illustrated) or the like formed inside the chuck table 12. Note that a chuck table for holding the wafer 11 by a mechanical method, an electrical method, or the like may be used in place of the chuck table 12. In a state in which the wafer 11 is disposed on the holding surface 12a of the chuck table 12 through the adhesive tape 19, a negative pressure of the suction source is made to act on the holding surface 12a, whereby the wafer 11 is suction held by the chuck table 12. Then, the chuck table 12 with the wafer 11 held thereon is moved to a position beneath the laser applying unit 14.

Next, the laser beam is applied from the laser applying unit 14 to the wafer 11. The laser applying unit 14 has a function of applying a pulsed laser beam of such a wavelength as to be absorbed in the wafer 11. Note that in the case where the protective film 23 is formed on the front surface 11a side of the wafer 11, the laser beam is applied to the wafer 11 through the protective film 23. While applying the laser beam from the laser applying unit 14 to the wafer 11, the chuck table 12 is moved along the longitudinal direction of the street 13 (direction indicated by an arrow A in FIG. 4A) such that the laser beam is applied along the street 13. By this, the wafer 11 is subjected to ablation processing, and a rectilinear laser processed groove 11c is formed along the street 13 on the front surface 11a side of the wafer 11.

Figure 4B:
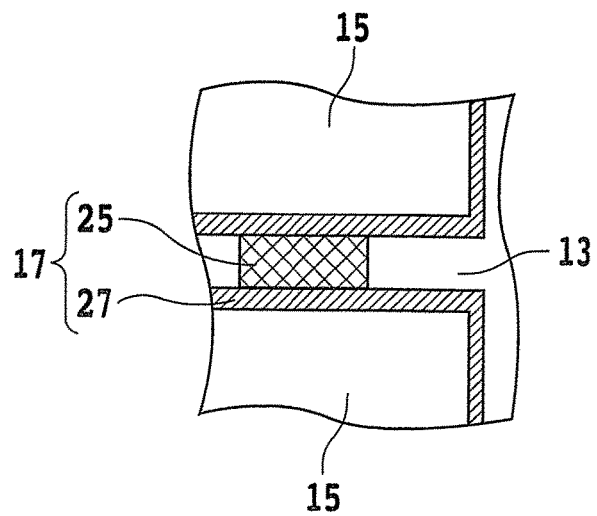
FIG. 4B is an enlarged plan view of a street formed with patterns including a metal layer.

In addition, when the laser beam is applied to the street 13 formed with the pattern 17, the patterns 17 are removed by the application of the laser beam. FIG. 4B is an enlarged plan view of the street 13 formed with the patterns 17. FIG. 4B depicts an example in which TEG 25 for device evaluation and pillars 27 as columnar metal patterns for supporting on the street an insulating film or the like formed at the time of production of devices 15 are formed as the patterns 17. Note that in FIG. 4B, the regions where the TEG 25 and the pillars 27 are formed are hatched.

Figure 4C:
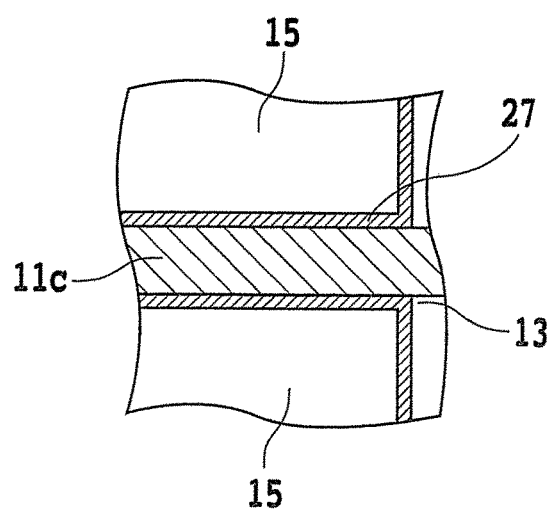
FIG. 4C is an enlarged plan view of the street from which the patterns including the metal layer have been removed and in which a laser processed groove has been formed.

When the laser beam is applied along the street 13, the laser beam is applied also to the TEG 25 and the pillars 27, whereby the TEG 25 and the pillars 27 are removed. FIG. 4C is an enlarged plan view of the street 13 from which the TEG 25 and the pillar 27 have been removed and in which the laser processed groove 11c has been formed. In FIG. 4C, the region where the laser processed groove 11c is formed is hatched. Note that the patterns 17 are used mainly in the production process of the devices 15, and do not relate to operations of the device chips obtained by dividing the wafer 11, so that removal of the patterns 17 does not affect the function of the device chips.

The laser beam is applied multiple times to the same street 13 until a laser processed groove 11c having a depth in excess of the finished thickness of the wafer 11 is formed. Note that the finished thickness of the wafer 11 corresponds to the thickness of device chips when the wafer 11 is processed finally into the device chips. Laser beam application conditions (the power, spot diameter, and repetition frequency of the laser beam, etc.) are set in such a manner that the laser processed grooves 11c can be formed in the wafer 11 and the patterns 17 can be removed. Note that the laser beam application conditions may be changed for the time of removing the patterns 17 and for the time of forming the laser processed grooves 11c in the wafer 11. In addition, it is unnecessary to completely remove the patterns 17 by the application of the laser beam. FIG. 4C depicts an example in which part of the pillars 27 are left on the streets 13. In this laser processing step, the patterns 17 including a metal layer are removed, not by use of a cutting blade but by use of the laser applying unit 14. Therefore, generation of burs can be prevented from occurring in the process of removing the patterns 17, and generation of electric discharge during plasma processing in a later step can be restrained.

Figure 5:
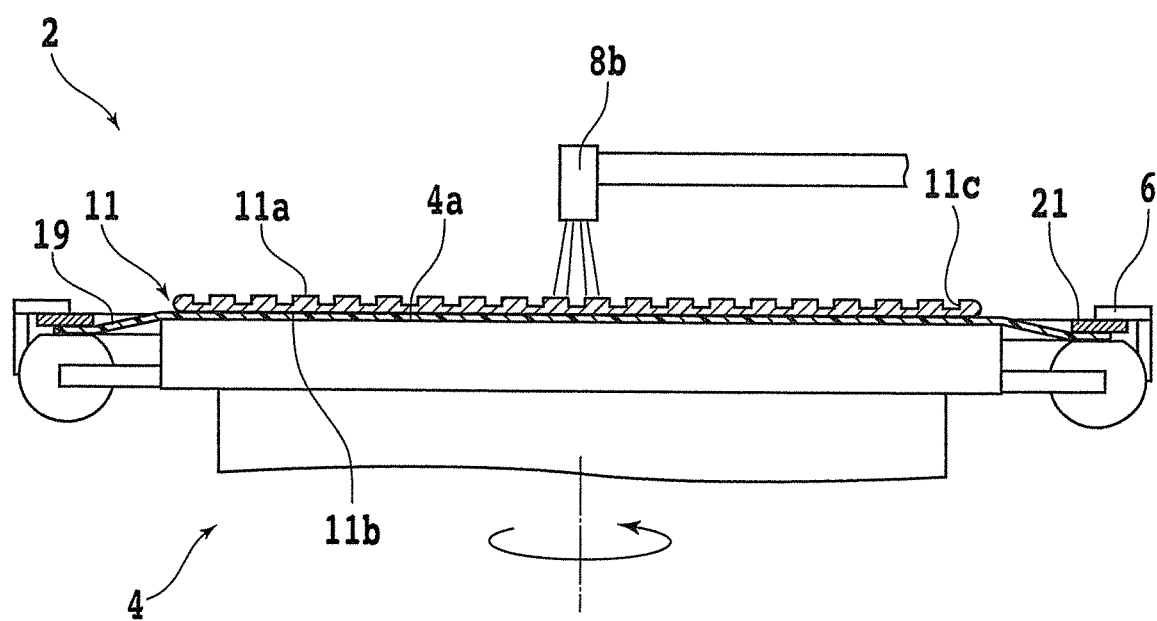
FIG. 5 is a partly sectional side view depicting the manner in which the protective film formed on the wafer is removed.

Subsequently, the protective film 23 is removed from the front surface 11a side of the wafer 11 (protective film removing step). FIG. 5 is a partly sectional side view depicting the manner in which the water-soluble protective film 23 formed on the front surface 11a side of the wafer 11 is removed.

First, like in the protective film forming step, the wafer 11 is suction held by the spinner table 4. Then, while the spinner table 4 with the wafer 11 suction held by the holding surface 4a thereof is being rotated around a rotational axis substantially parallel to the vertical direction, pure water is jetted from a nozzle 8b located on the upper side of the spinner table 4. By this, the water-soluble protective film 23 formed on the front surface 11a side of the wafer 11 is removed together with debris deposited on the wafer 11. Thus, since the protective film 23 is formed using a water-soluble resin (protective film forming step), it can be washed away with pure water. Therefore, the protective film 23 can be removed extremely easily. Note that the removal of the protective film 23 may be conducted by jetting to the wafer 11 a mixed fluid of pure water with a gas (air, etc.). Note that in the case where the protective film forming step is not performed and no protective film is formed on the front surface 11a of the wafer 11, it is unnecessary to perform the protective film removing step.

Figure 6A:
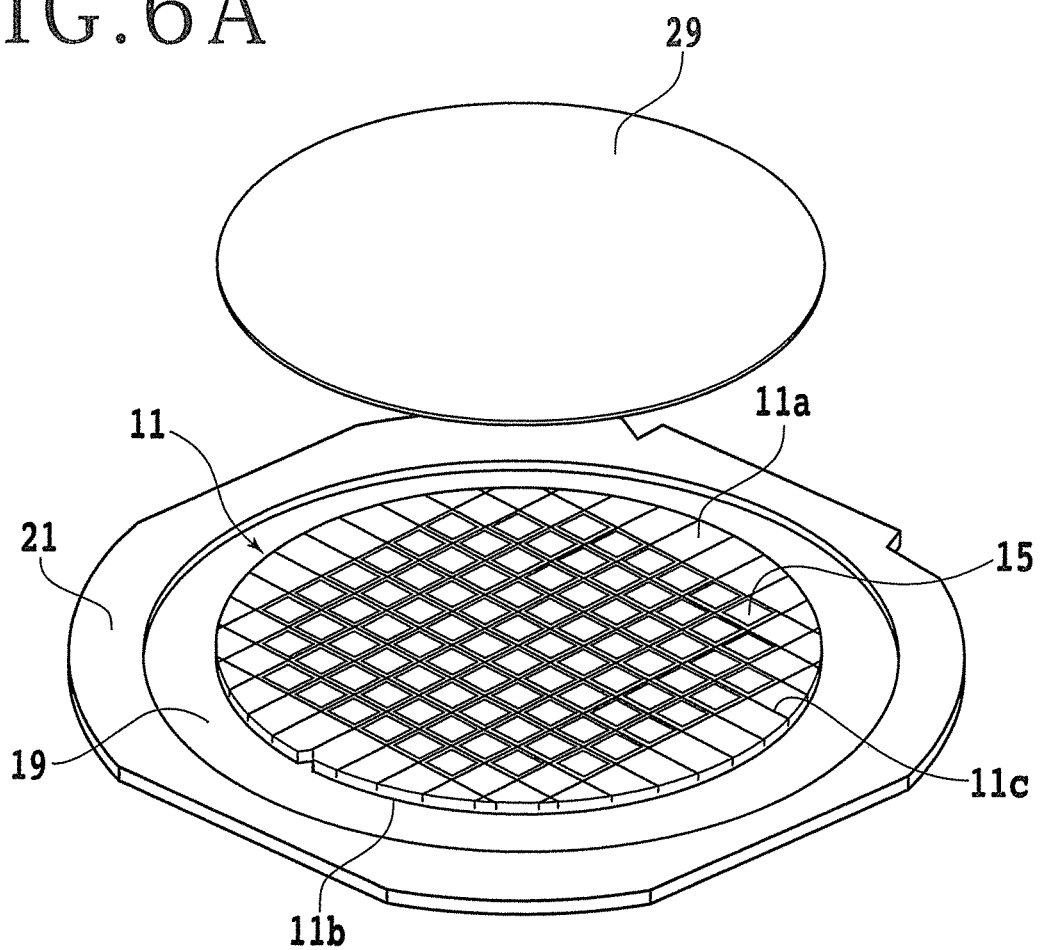
FIG. 6A is a perspective view depicting the manner in which a protective member is adhered to the wafer.
Figure 6B:
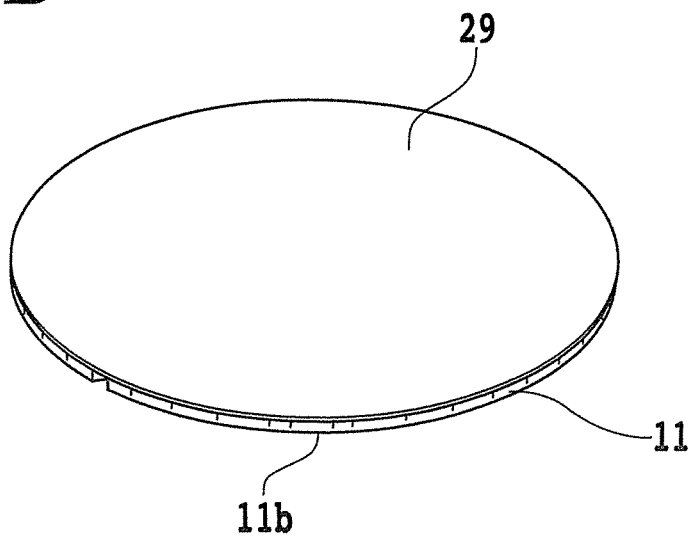
FIG. 6B is a perspective view of the wafer to which the protective member has been adhered.

Subsequently, a protective member is adhered to the front surface 11a side of the wafer 11 (protective member adhering step). FIG. 6A is a perspective view depicting the manner in which the protective member 29 is adhered to the wafer 11. As illustrated in FIG. 6A, the protective member 29, disk-like in shape, is adhered to the front surface 11a side of the wafer 11 such as to cover the devices 15. As the protective member 29, there can be used, for example, a tape formed from a flexible resin or the like. FIG. 6B is a perspective view depicting the wafer 11 to which the protective member 29 has been adhered. By the protective member 29, the devices 15 formed on the front surface 11a side of the wafer 11 are protected in later steps (a grinding step, a crushed layer removing step, and a strain layer forming step). Note that FIG. 6B denotes a state in which the wafer 11 has been peeled from the adhesive tape 19 and been detached from the annular frame 21.

Figure 7:
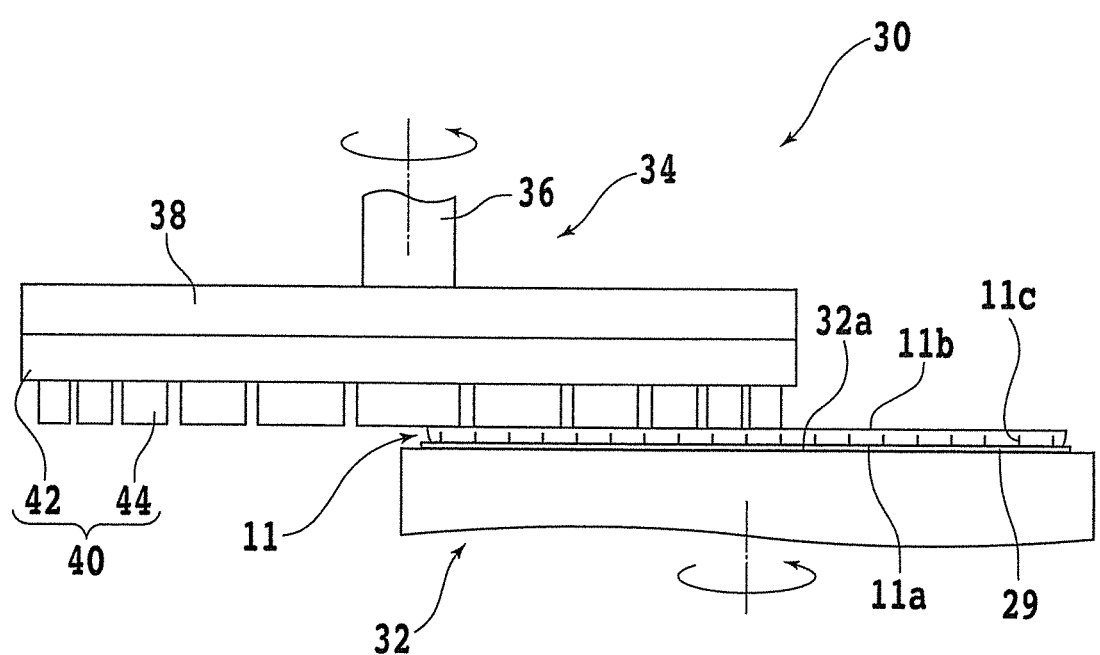
FIG. 7 is a side view depicting the manner in which the back surface side of the wafer is ground.

Next, the back surface 11b side of the wafer 11 is ground to thin the wafer 11 to the finished thickness and to expose the laser processed grooves 11c to the back surface 11b, thereby dividing the wafer 11 into a plurality of device chips (grinding step). FIG. 7 is a side view depicting the manner in which the back surface 11b side of the wafer 11 is ground.

The grinding of the wafer 11 is conducted, for example, by using a grinding apparatus 30 depicted in FIG. 7. The grinding apparatus 30 includes a chuck table 32 for suction holding the wafer 11. The chuck table 32 is connected to a rotational drive source (not illustrated) such as a motor, and is rotated around a rotational axis substantially parallel to the vertical direction. In addition, a moving mechanism (not illustrated) is provided under the chuck table 32, and the moving mechanism has a function of moving the chuck table 32 in a horizontal direction.

An upper surface of the chuck table 32 constitutes a holding surface 32a for suction holding the wafer 11. The holding surface 32a is connected to a suction source (not illustrated) through a suction passage (not illustrated) or the like formed inside the chuck table 32. In the state in which the wafer 11 is disposed on the holding surface 32a through the protective member 29, a negative pressure of the suction source is made to act on the holding surface 32a, whereby the wafer 11 is suction held by the chuck table 32. Note that a chuck table for holding the wafer 11 by a mechanical method, an electrical method, or the like may be used in place of the chuck table 32.

A grinding unit 34 is disposed on the upper side of the chuck table 32. The grinding unit 34 includes a spindle housing (not illustrated) supported by a lift mechanism (not illustrated). A spindle 36 is accommodated in the spindle housing, and a disk-shaped mount 38 is fixed to a lower end portion of the spindle 36.

A grinding wheel 40 substantially equal in diameter to the mount 38 is mounted to a lower surface of the mount 38. The grinding wheel 40 includes a wheel base 42 formed from a metallic material such as stainless steel or aluminum. A plurality of grindstones 44 are arranged on a lower surface of the wheel base 42. A rotational drive source (not illustrated) such as a motor is connected to the upper end side (base end side) of the spindle 36, and the grinding wheel 40 is rotated around a rotational axis substantially parallel to the vertical direction by a force generated from the rotational drive source. In the inside or the vicinity of the grinding unit 34, there is provided a nozzle (not illustrated) for supplying a grinding liquid such as pure water to the wafer 11 and the like.

At the time of grinding the wafer 11, first, in a state in which the wafer 11 is disposed on the holding surface 32a through the protective member 29, a negative pressure of the suction source is made to act on the holding surface 32a. As a result, the wafer 11 is suction held by the chuck table 32 in the state in which the back surface 11b side thereof is exposed to the upper side.

Subsequently, the chuck table 32 is moved to a position beneath the grinding unit 34. Then, while rotating the chuck table 32 and the grinding wheel 40 respectively and while supplying the grinding liquid to the back surface 11b side of the wafer 11, the spindle 36 is lowered. Note that the position and the lowering speed of the spindle 36 are adjusted in such a manner that lower surfaces of the grindstones 44 are pressed against the back surface 11b side of the wafer 11 with an appropriate force. By this, the back surface 11b side is ground, and the wafer 11 is thinned. When the wafer 11 is thinned and the laser processed grooves 11c are exposed to the back surface 11b of the wafer 11, the wafer 11 is divided into the plurality of device chips each of which includes the device 15. Then, when the wafer 11 is thinned to the finished thickness, the grinding is completed. Note that the wafer 11 is ground by use of one set of grinding unit in the present embodiment, the wafer 11 may be ground by use of two or more sets of grinding units. In that case, for example, rough grinding is conducted using grindstones containing abrasive grains larger in diameter, and finish grinding is performed using grindstones containing abrasive grains smaller in diameter, whereby flatness of the back surface 11b can be enhanced without largely prolonging the time required for grinding.

Figure 8:
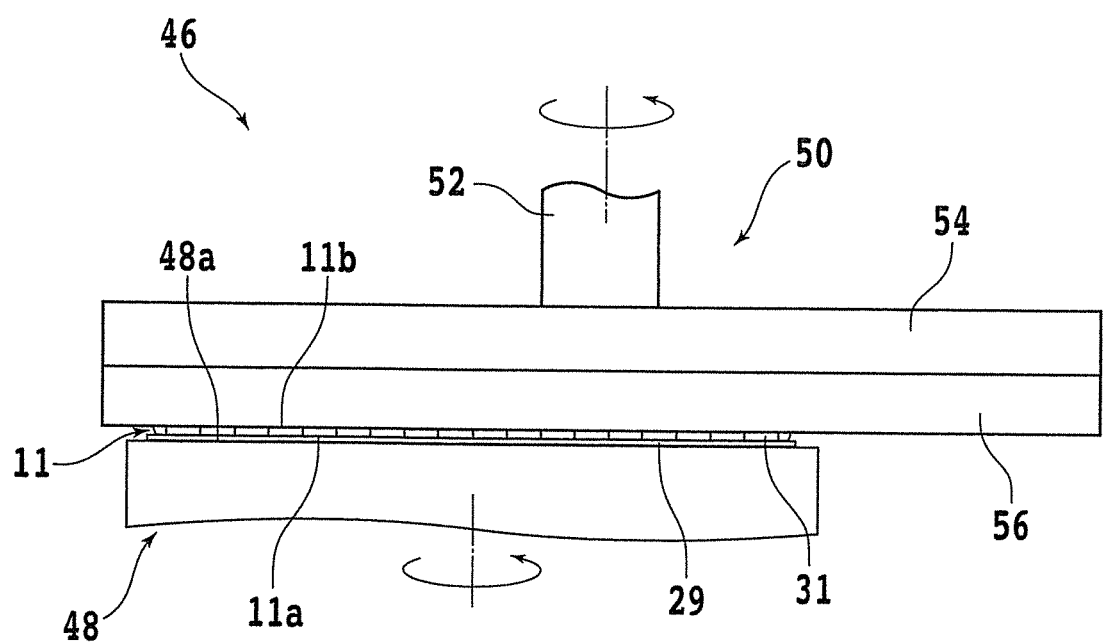
FIG. 8 is a side view depicting the manner in which the back surface side of the wafer is polished.

When the back surface 11b side of the wafer 11 is ground by the grindstones, minute ruggedness (minute projections and recesses) or cracks are formed on the back surface 11b side of the wafer 11. The presence of a region (crushed layer) where the ruggedness or cracks are formed leads to a lowering in the die strength of the device chips obtained by dividing the wafer 11. Therefore, the crushed layer formed on the back surface 11b side of the wafer 11 is removed (crushed layer removing step). The crushed layer can be removed, for example, by polishing conducted using a polishing pad. FIG. 8 is a side view depicting the manner in which the back surface 11b side of the wafer 11 is polished by a polishing pad.

The polishing of the wafer 11 is performed, for example, by use of a polishing apparatus 46 depicted in FIG. 8. The polishing apparatus 46 includes a chuck table 48 for suction holding the wafer 11. The chuck table 48 is connected to a rotational drive source (not illustrated) such as a motor, and is rotated around a rotational axis which is substantially parallel to the vertical direction. In addition, a moving mechanism (not illustrated) is provided under the chuck table 48, and the moving mechanism has a function of moving the chuck table 48 in a horizontal direction. An upper surface of the chuck table 48 constitutes a holding surface 48a for suction holding the wafer 11. The holding surface 48a is connected to a suction source (not illustrated) through a suction passage (not illustrated) or the like formed inside the chuck table 48. In the state in which the wafer 11 is disposed on the holding surface 48a through the protective member 29, a negative pressure of the suction source is made to act on the holding surface 48a, whereby the wafer 11 is suction held by the chuck table 48. Note that a chuck table for holding the wafer 11 by a mechanical method, an electrical method, or the like may be used in place of the chuck table 48.

A polishing unit 50 is disposed on the upper side of the chuck table 48. The polishing unit 50 includes a spindle housing (not illustrated) supported by a lift mechanism (not illustrated). A spindle 52 is accommodated in the spindle housing, and a disk-shaped mount 54 is fixed to a lower end portion of the spindle 52. A polishing pad 56 is mounted to a lower surface of the mount 54. The polishing pad 56 includes a polishing fabric formed from nonwoven fabric, polyurethane foam, or the like. A rotational drive source (not illustrated) including a motor or the like is connected to the upper end side (base end side) of the spindle 52, and the polishing pad 56 is rotated around a rotational axis substantially parallel to the vertical direction by a force generated by the rotational drive source. Note that the polishing unit 50 may be formed therein with a supply passage (not illustrated) for supplying a polishing liquid to the wafer 11 held by the chuck table 48. For example, a slurry containing abrasive grains dispersed in a liquid reactive to the wafer 11 can be supplied as the polishing liquid to the wafer 11 through the supply passage.

In the crushed layer removing step, first, the protective member 29 is put in contact with the holding surface 48a of the chuck table 48, and the negative pressure of the suction source is made to act there. As a result, the wafer 11 is suction held by the chuck table 48 in the state in which the back surface 11b side thereof is exposed to the upper side. Note that the wafer 11 has been divided into the plurality of device chips 31 by the grinding step. Next, the chuck table 48 is moved to a position beneath the polishing unit 50. Then, while supplying the polishing liquid to the back surface 11b side of the wafer 11, the chuck table 48 and the polishing pad 56 are rotated respectively, and the spindle 52 is lowered. Note that the lowering amount of the spindle 52 is adjusted to such an extent that a lower surface (polishing surface) of the polishing pad 56 is pressed against the back surface 11b side of the wafer 11. In this way, the back surface 11b of the wafer 11 is polished, whereby the crushed layer formed on the back surface 11b side of the wafer 11 by the grinding in the grinding step is removed. By the removal of the crushed layer, the die strength of the device chips 31 can be enhanced.

Note that while wet polishing in which the polishing liquid is supplied to the wafer 11 has been descried above, dry polishing in which the polishing liquid is not used may also be used for polishing the wafer 11. In addition, the method for removing the crushed layer is not limited to the polishing by the polishing pad 56. For example, plasma etching using a halogen gas may be used to remove the crushed layer. The details of the plasma etching will be described later.

Figure 9:
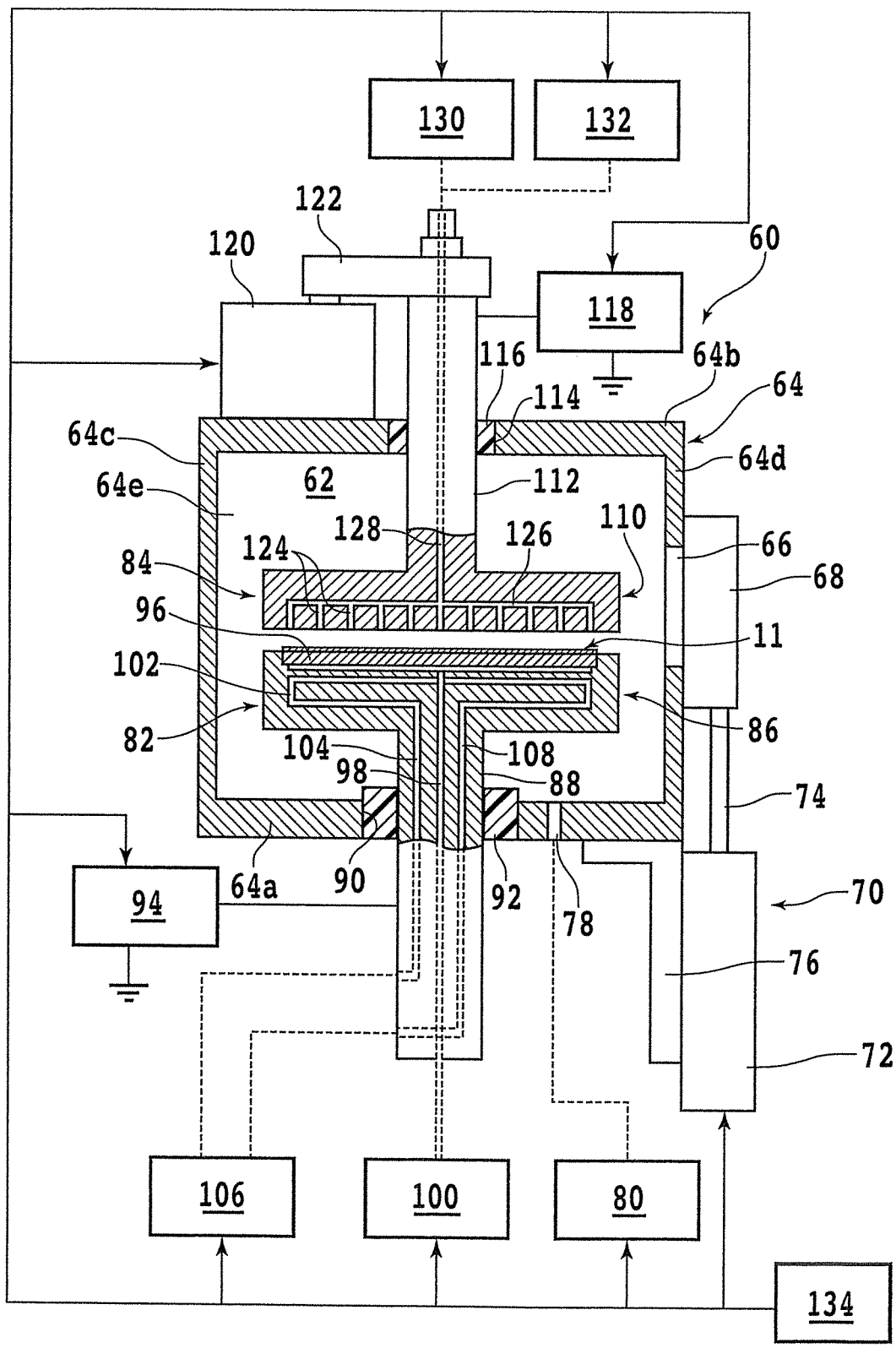
FIG. 9 is a sectional schematic view depicting a configuration example of a plasma treatment apparatus.

Next, using plasma etching using an inert gas, strain including minute ruggedness (minute projections and recesses) or cracks is formed on the back surface 11b side of the wafer 11 (strain layer forming step). For the strain formation, a plasma treatment apparatus can be used. FIG. 9 is a sectional schematic view denoting a configuration example of a plasma treatment apparatus 60 which can be used for forming the strain.

The plasma treatment apparatus 60 includes a vacuum chamber 64 forming a treatment space 62. The vacuum chamber 64 is formed in a rectangular parallelepiped shape including a bottom wall 64a, an upper wall 64b, a first side wall 64c, a second side wall 64d, a third side wall 64e, and a fourth side wall (not illustrated), with the second side wall 64d being provided with an opening 66 for carrying the wafer 11 in and out. On the outside of the opening 66 is provided a gate 68 for closing and opening the opening 66. The gate 68 is moved upward and downward by an opening/closing mechanism 70. The opening/closing mechanism 70 includes an air cylinder 72 and a piston rod 74. The air cylinder 72 is fixed to the bottom wall 64a of the vacuum chamber 64 through a bracket 76, and a tip of the piston rod 74 is connected to a lower portion of the gate 68. With the gate 68 opened by the opening/closing mechanism 70, the wafer 11 can be carried into the treatment space 62 of the vacuum chamber 64 through the opening 66, or the wafer 11 can be carried out of the treatment space 62 of the vacuum chamber 64. An exhaust port 78 is formed in the bottom wall 64a of the vacuum chamber 64. The exhaust port 78 is connected to an exhaust mechanism 80 such as a vacuum pump.

A lower electrode 82 and an upper electrode 84 are disposed opposite to each other, in the treatment space 62 of the vacuum chamber 64. The lower electrode 82 is formed from a conductive material, and includes a disk-shaped holding section 86 and a cylindrical support section 88 projecting downward from the center of a lower surface of the holding section 86. The support section 88 is inserted in an opening 90 formed in the bottom wall 64a of the vacuum chamber 64. In the opening 90, an annular insulating member 92 is disposed between the bottom wall 64a and the support section 88, whereby the vacuum chamber 64 and the lower electrode 82 are insulated from each other. The lower electrode 82 is connected to a high-frequency power supply 94 in the exterior of the vacuum chamber 64.

An upper surface of the holding section 86 is formed with a recess, and a table 96 on which to place the wafer 11 is provided in the recess. The table 96 is formed therein with a suction passage (not illustrated), which is connected to a suction source 100 through a flow path 98 formed inside the lower electrode 82. In addition, the holding section 86 is formed therein with a cooling flow path 102. One end of the cooling flow path 102 is connected to a coolant circulation mechanism 106 through a coolant introduction passage 104 formed in the support section 88, whereas the other end of the cooling flow path 102 is connected to a coolant circulation mechanism 106 through a coolant discharge passage 108 formed in the support section 88. When the coolant circulation mechanism 106 is operated, a coolant flows through the coolant introduction passage 104, the coolant flow path 102, and the coolant discharge passage 108 in this order, to cool the lower electrode 82.

The upper electrode 84 is formed from a conductive material, and includes a disk-shaped gas jetting section 110 and a cylindrical support section 112 projecting upward from the center of an upper surface of the gas jetting section 110. The support section 112 is inserted in an opening 114 formed in the upper wall 64b of the vacuum chamber 64. In the opening 114, an annular insulating member 116 is disposed between the upper wall 64b and the support section 112, whereby the vacuum chamber 64 and the upper electrode 84 are insulated from each other. The upper electrode 84 is connected to a high-frequency power supply 118 in the exterior of the vacuum chamber 64. In addition, a support arm 122 connected to a lift mechanism 120 is attached to an upper end portion of the support section 112, and the upper electrode 84 is moved upward and downward by the lift mechanism 120 and the support arm 122. A lower surface of the gas jetting section 110 is provided with a plurality of jet ports 124. The jet ports 124 are connected to a first gas supply source 130 and a second gas supply source 132 through a flow path 126 formed in the gas jetting section 110 and a flow path 128 formed in the support section 112. The first gas supply source 130, the second gas supply source 132, the flow paths 126 and 128, and the jet ports 124 constitute a gas introduction section for introducing gases into the vacuum chamber 64.

The opening/closing mechanism 70, the exhaust mechanism 80, the high-frequency power supply 94, the suction source 100, the coolant circulation mechanism 106, the high-frequency power supply 118, the lift mechanism 120, the first gas supply source 130, the second gas supply source 132, and the like are connected to a control device 134. Information on the pressure inside the treatment space 62 is inputted from the exhaust mechanism 80 to the control device 134. In addition, information on the temperature of the coolant (or information on the temperature of the lower electrode 82) is inputted from the coolant circulation mechanism 106 to the control device 134. Further, information on the flow rates of gasses is inputted from the first gas supply source 130 and the second gas supply source 132 to the control device 134. Based on these pieces of information and other information inputted from the user and the like, the control device 134 outputs control signals for controlling the aforementioned components of the plasma treatment apparatus 60.

In the strain layer forming step, first, the gate 68 of the plasma treatment apparatus 60 is lowered by the opening/closing mechanism 70. Next, the wafer 11 is carried via the opening 66 into the treatment space 62 of the vacuum chamber 64, and is placed on the table 96 of the lower electrode 82, with its back surface 11b side exposed to the upper side. Note that at the time of carrying the wafer 11 in, it is preferable to preliminarily raise the upper electrode 84 by the lift mechanism 120 to enlarge the spacing between the lower electrode 82 and the upper electrode 84. Thereafter, a negative pressure of the suction source 100 is made to act, thereby fixing the wafer 11 on the table 96. Besides, the gate 68 is raised by the opening/closing mechanism 70, to hermetically close the treatment space 62. Further, the height position of the upper electrode 84 is adjusted by the lift mechanism 120 in such a manner that the upper electrode 84 and the lower electrode 82 are put into a predetermined positional relation suitable for plasma processing. In addition, the exhaust mechanism 80 is operated to establish a vacuum (low pressure) in the treatment space 62. Note that in the case where it is difficult to hold the wafer 11 by the negative pressure of the suction source 100 after reducing the pressure inside the treatment space 62, the wafer 11 is held on the table 96 by an electrical force (typically, an electrostatic force) or the like. For example, by embedding electrodes inside the table 96 and supplying the electrodes with electric power, an electrical force can be made to act between the table 96 and the wafer 11.

In this state, while a gas for plasma processing is supplied at a predetermined flow rate, predetermined high-frequency electric power is supplied to the lower electrode 82 and the upper electrode 84. In the strain layer forming step according to the present embodiment, while a predetermined pressure (for example, a pressure of 5 to 50 Pa) is maintained in the treatment space 62, predetermined high-frequency electric power (for example, 1,000 to 3,000 W) is supplied to the lower electrode 82 and the upper electrode 84 while supplying an inert gas such as a rare gas at a predetermined flow rate from the first gas supply source 130. As a result, a plasma is generated between the lower electrode 82 and the upper electrode 84, ions generated from the plasmatized inert gas are attracted to the lower electrode 82 side, and are applied to the back surface 11b of the wafer 11. Then, the back surface 11b of the wafer 11 is sputtered, whereby minute ruggedness (minute projections and recesses) or cracks (strain) are formed in the back surface 11b. The region formed with the strain (strain layer) functions as a gettering layer for capturing metallic elements contained in the inside of the wafer 11.

Figure 10:
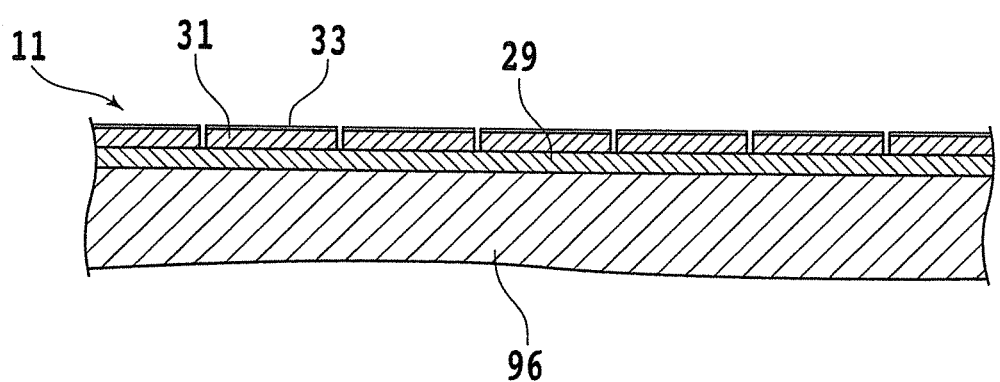
FIG. 10 is an enlarged sectional view of the wafer in the state of having been formed with a strain layer.

FIG. 10 is an enlarged sectional view of the wafer 11 in the state of having been formed with a strain layer 33. The wafer 11 having been divided into the plurality of device chips 31 through the grinding step is disposed on the table 96 through the protective member 29, and the back surface 11b side of the wafer 11 is exposed toward the upper electrode 84 (see FIG. 9). When the plasma processing using the inert gas is applied to the wafer 11, the strain layer 33 is formed on the back surface 11b side of the wafer 11. In the strain layer forming step, the patterns 17 are removed not by cutting conducted using a cutting blade but by ablation processing by application of a laser beam (see FIG. 4A), and the plasma processing is applied to the wafer 11 in which generation of burs has been restrained. Therefore, generation of electric discharge at the time of the plasma processing is restrained, and breakage of the devices 15 is prevented. By the formation of the strain layer 33, a gettering effect is obtained by which metallic elements contained in the inside of the wafer 11 are captured to the back surface 11b side of the wafer 11. Note that the strain layer 33 formed by the plasma processing has an extremely small thickness (for example, 1/10 times or below) as compared to the crushed layer formed by the grinding step. Therefore, the formation of the strain layer 33 would not lead to a large lowering in the die strength of the wafer 11.

As has been described above, in the wafer processing method according to the present embodiment, laser processed grooves 11c having a depth in excess of the finished thickness of the wafer 11 are formed while removing the patterns 17 including a metal layer that are formed on the streets 13 of the wafer 11, by application of the laser beam. By this, the wafer 11 can be processed without using a cutting blade, and generation of metal burs is restrained. Therefore, at the time of applying plasma processing to the wafer 11 to form the strain layer 33 on the back surface 11b of the wafer 11, damaging of the devices due to electric discharge to the burs is prevented.

Note that while the crushed layer removing step of removing the crushed layer by polishing with the polishing pad 56 has been described in the present embodiment (see FIG. 8), the crushed layer can also be removed by plasma etching using the plasma treatment apparatus 60 denoted in FIG. 9 in the crushed layer removing step. In the case of removing the crushed layer by the plasma etching, the wafer 11 having been divided into the plurality of device chips 31 is disposed on the table 96 of the plasma treatment apparatus 60 through the protective member 29, like in FIG. 10. In this state, high-frequency electric power is supplied to the lower electrode 82 and the upper electrode 84 while supplying a gas for etching. Specifically, the inside of the treatment space 62 is maintained at a predetermined pressure (for example, 50 to 300 Pa), and predetermined high-frequency electric power (for example, 1,000 to 3,000 W) is supplied to the lower electrode 82 and the upper electrode 84 while supplying a halogen-containing gas such as SF6 from the second gas supply source 132 at a predetermined flow rate. Note that the distance between the lower electrode 82 and the upper electrode 84 is set larger than that at the time of performing the strain layer forming step. By this, the voltage to be impressed on the wafer 11 is lowered as compared to that at the time of performing the strain layer forming step.

By the above-mentioned step, a plasma is generated between the lower electrode 82 and the upper electrode 84, and an active substance generated by the plasma acts on the back surface 11b of the wafer 11, whereby the back surface 11b of the wafer 11 is etched. In this way, the crushed layer formed on the back surface 11b of the wafer 11 is removed. This plasma etching also is applied to the wafer 11 which has been subjected to the laser processing step and in which generation of burs has been restrained. Therefore, in the crushed layer removing step, also, electric discharge can be restrained, and damaging of the devices 15 is prevented.

Other than the foregoing, the structures, methods, and the like according to the present embodiment can be modified, as required, in carrying out the present invention, within the scope of the object of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method for processing a wafer in which devices are formed respectively in regions on a front surface side partitioned by a plurality of streets and in which patterns including a metal layer are formed on the streets, the method comprising:
   a laser processing step of applying a laser beam of such a wavelength as to be absorbed in the wafer along the streets formed with the patterns, to form laser processed grooves having a depth in excess of a finished thickness of the wafer while removing the patterns;
   a protective member adhering step of adhering a protective member to the front surface side of the wafer formed with the laser processed grooves;
   a grinding step of holding the wafer by a chuck table through the protective member, grinding a back surface side of the wafer to thin the wafer to the finished thickness, and to expose the laser processed grooves to the back surface of the wafer, thereby dividing the wafer into a plurality of device chips;
   a crushed layer removing step of removing a crushed layer formed on the back surface side of the wafer by the grinding of the wafer; and
   a strain layer forming step of forming a strain layer on the back surface side of the wafer deprived of the crushed layer, by plasma processing using an inert gas.

2. The method for processing a wafer according to claim 1, wherein in the crushed layer removing step, the crushed layer is removed by polishing with a polishing pad.

3. The method for processing a wafer according to claim 1, wherein in the crushed layer removing step, the crushed layer is removed by plasma etching using a halogen-containing gas.

4. The method for processing a wafer according to claim 1, further comprising:
   a protective film forming step of forming a water-soluble protective film on the front surface side of the wafer before the laser processing step, and a protective film removing step of removing the protective film from the front surface side of the wafer after the laser processing step.

* * * * *